United States Patent
Kuo et al.

(10) Patent No.: US 11,610,758 B2
(45) Date of Patent: Mar. 21, 2023

(54) CHARGED PARTICLE BEAM LITHOGRAPHY SYSTEM

(71) Applicant: KKT Holdings Syndicate, Dover, DE (US)

(72) Inventors: Tzu-Yi Kuo, Taipei (TW); Yu-Kuang Tseng, Taipei (TW)

(73) Assignee: KKT HOLDINGS SYNDICATE, Dover, DE (US)

( * ) Notice: Subject to any disclaimer, the term of this patent is extended or adjusted under 35 U.S.C. 154(b) by 10 days.

(21) Appl. No.: 16/743,249

(22) Filed: Jan. 15, 2020

(65) Prior Publication Data
US 2020/0227235 A1  Jul. 16, 2020

Related U.S. Application Data

(60) Provisional application No. 62/792,628, filed on Jan. 15, 2019.

(51) Int. Cl.
*H01J 37/317* (2006.01)
*H01J 37/141* (2006.01)
*G03F 1/20* (2012.01)
*H01J 37/30* (2006.01)

(52) U.S. Cl.
CPC ............ *H01J 37/3175* (2013.01); *G03F 1/20* (2013.01); *H01J 37/141* (2013.01); *H01J 37/3007* (2013.01); *H01J 2237/032* (2013.01); *H01J 2237/04928* (2013.01)

(58) Field of Classification Search
CPC .. H01J 37/141; H01J 37/3007; H01J 37/3175; H01J 2237/3175; H01J 2237/31753; H01J 2237/31754; H01J 2237/04298; H01J 2237/032
See application file for complete search history.

(56) References Cited

U.S. PATENT DOCUMENTS

| | | | |
|---|---|---|---|
| 6,214,498 B1* | 4/2001 | Choi | G03F 1/20 430/296 |
| 6,906,305 B2* | 6/2005 | Pease | G03F 7/70591 250/311 |
| 7,391,034 B1* | 6/2008 | Bertsche | H01J 37/3175 250/311 |
| 2002/0070354 A1* | 6/2002 | Shimazu | G03F 1/20 250/492.2 |
| 2003/0010749 A1* | 1/2003 | Yoshizawa | G03F 1/20 430/5 |
| 2003/0034460 A1* | 2/2003 | Ono | H01J 37/3174 250/492.1 |
| 2004/0149933 A1* | 8/2004 | Kawamura | G21K 1/087 250/492.1 |

(Continued)

OTHER PUBLICATIONS

Kim and Trumper, "High-Precision Magnetic Levitation Stage for Photolithography", Precision Engineering vol. 22, Issue 2, Apr. 1998, p. 66-77.) (Year: 1998).*

*Primary Examiner* — David E Smith
(74) *Attorney, Agent, or Firm* — WPAT, PC

(57) ABSTRACT

A collimated electron beam is illuminated to a grounded metal mask such that patterns on the mask can be transferred to a substrate identically. In a preferred embodiment, a linear electron source can be provided for enhancing lithographic throughput. The metal mask is adjacent to the substrate, but does not contact with substrate.

18 Claims, 16 Drawing Sheets

(56) References Cited

U.S. PATENT DOCUMENTS

2005/0012052 A1* 1/2005 Platzgummer ......... B82Y 10/00
250/492.21
2016/0274474 A1* 9/2016 Utsumi ............... G03F 7/70725
2018/0358199 A1* 12/2018 Kumamoto ............. H01J 37/22

* cited by examiner

US 11,610,758 B2

CHARGED PARTICLE BEAM LITHOGRAPHY SYSTEM

CLAIM OF PRIORITY

This application claims the benefit of priority of [U.S. provisional application No. 62/792,628] entitled to inventors filed [Jan. 15, 2019] and entitled "[Ebeam Lithography]", the entire disclosures of which are incorporated herein by reference.

FIELD OF THE INVENTION

The invention generally relates to a charged particle beam lithography system, and more particular to an ebeam lithography system with metal mask. However, it would be recognized that the invention has a much broader range of applicability.

BACKGROUND OF THE INVENTION

The following description and examples are not admitted to be prior art by virtue of their inclusion in this section.

In semiconductor manufacturing process, lithography is the most critical part to the Moore's law. Traditional lithography process includes steps of coating a photoresist layer on a layer, pre-baking the photoresist layer, exposing the photoresist layer with a mask, developing the photoresist layer such that patterns on the mask can be transferred to the photoresist layer, hard-baking the photoresist layer, and stripping the photoresist layer after the layer has been etched by using the patterned photoresist layer as a mask.

Before the 10 nm semiconductor process node, major available commercial lithography system is immersion DUV (deep Ultraviolet) system with multiple patterning. The next commercial available lithography generation is EUV lithography system with wavelength 13.5 nm light source. However, there are some issues to the EUV lithography system. First, most materials will absorb the EUV light, particularly to the 13.5 nm, so there is no lens to focus the EUV beam on the photoresist. A solution is the new, sophisticated reflective lithography system. Except lenses, even air and de-ionized (DI) water will absorb the EUV light, and the EUV lithography must be operated in vacuum environment and there is no more immersion type applied to the EUV lithography system. Even mirrors are used to replace the lens in the EUV lithography system, each mirror still absorb a small portion of EUV light, and thus only 7% EUV light can reach the photoresist layer after several times reflections from the EUV light source. An extremely ultra large power source is thus necessary provided to enhance throughput, and power consumption pf the EUV lithography will approach to one power plant. Another issue is the temperature at reticle is about 600° C. in operation. Such a high temperature in local area of the EUV reticle will incur local pattern distortions, unless heat dissipations can fulfill requirement of no local high temperature. According to principle of uncertainty, the wavelength of 13.5 nm cannot produce pattern smaller than 13.5 nm, while the present critical dimension has been reached to 14 nm. EUV lithography cannot be used to manufacture critical dimension with less than 14 nm pattern in single exposure process. That means multiple pattern should be applied to reduce critical dimension. Moreover, the EUV reticle or EUV mask can't be inspected commercially, and a protection layer, pellicle, on the EUV reticle, increases complexity of the EUV reticle inspection.

The stochastic issue, particularly for an array of patterns, that each pattern can't be produced individually exactly the same, still bothers the semiconductor manufacturer and the cause of the stochastic issue is still unknown. Some papers intend to give the possible reasons that photon energy per DUV photon (193 nm photon) is 6.4 eV while the EUV photon is 91-93 eV. The development condition for DUV system is about 92 photons in a 1 nm square area while the EUV system needs only 4-5 EUV photons in 1 nm square area. According to the uncertainty principle, if even one EUV photon missed, the development condition will fail directly, overexposure or underexposure.

In the following with illustration of FIG. 1, a possible reason to explain the stochastic issue by using uncertainty principle is provided. For a EUV photon with 13.5 nm, the uncertainty dimension is the wavelength, 13.5 nm, of the EUV photon. Please refer to FIG. 1A, there is a circle 20 with a diameter 13.5 nm to be formed on a photoresist layer. The size of a EUV photon can be considered as zero. For one nanometer square area or one nanometer diameter circle 10, the EUV photoresist layer to be developed should be 4.5 photons. Thus, if one EUV photon disappears at a specific area, there should be under exposure to the specific area. On the other hand, if one more EUV photon strikes at a specific area, the specific area is over exposure. The more EUV photons will incur over exposure, while the less EUV photons will incur under exposure. Please refer to FIG. 1B, the circle 4 is the normal exposure, the circle 5 is over exposure, and the circles 1-3 are under exposure. The pattern 22 is developed with illustration of circles 1-5. Within most central portion of the developed pattern 22, the area should be well developed. However, some circle at the peripheral regions of the developed pattern 22 should be over exposure or under exposure according uncertainty principle. In FIG. 1C, it's a drawing showing 16 identical pattern array in EUV mask by using EUV lithography and a layer is then etched. Please note that there is no pattern identical with each other.

Another prior art, nanoimprint lithography (NIL), which direct imprints patterns to the photoresist layer, can transfer 5 nm patterns theoretically. However, this kind of contact pattern transferring will contaminate the NIL mask, and patterns on the NIL mask may distort after several times imprinting; that's life issue. Further, commercial solution is seldom available with less complete industrial chain, only Cannon providing NIL system with only one user, Toshiba. Throughput of the NIL is another key issue compared to the DUV lithography system.

Another prior art, ebeam direct writer (EBDW), which uses electron beam focused and scanned on photoresist with patterns directly, has ultrahigh resolution, 1.5 nm, compared to EUV system and NIL system. The photoresist used in the EBDW will use some other "electron" initiator as well as corresponding development such that the photoresist layer can be developed if the electrons have reached the photoresist layer. If there is no pattern, the electron beam will be blanked out and thus there is no pattern will be transferred to the photoresist layer. However, there is no throughput to this system compared to any other conventional lithography system, only nine dice manufactured in three months. Thus, the EBDW is applied to the manufacture of the mask or reticle.

In order to solve the throughput issue in the EBDW, multibeam technology is developed, but Coulomb compulsion force between neighbor beams would be an issue. However, the major manufacturer of multiple beam lithography system, Mapper, has ceased this project in 2018 and later merged by ASML.

For current art, semiconductor process node, transistors per unit square area, is used to identify semiconductor manufacture generation, instead of critical dimension, because it is too difficult to shrink the critical dimension directly. There are some issues to manufacture less than 10 nm critical dimension patterns if the EUV system is used. Therefore, there is a necessary to provide a new tool to continue shrink the critical dimension.

BRIEF SUMMARY OF THE INVENTION

The object of this invention is to provide a lithography apparatus to transfer patterns with dimensions less than 14 nm. Charged particle beam is used as exposure source in the lithography system, and a preferred exposure source is electron beam. The electron beam, in the conventional ebeam direct writer (EBDW) can have a resolution about 1.5 nm and can have higher resolution if higher landing energy is provided.

It is an objective to provide a high resolution lithography system without OPC issue in the conventional DUV system incurred from the interference from the DUV light.

It is an objective to provide a high throughput lithography system compared to conventional EBDW by using a metallic mask. Although throughput of DUV lithography system is very high, about 250 wafers per hour, the multiple patterning procedures still limit the whole throughput of the DUV lithography system. In the present invention, only one patterning procedure is necessary, and the complete patterning throughput of the present lithography system still competes to the conventional DUV lithography system.

It is an objective to provide a lithography system with matured and commercial available technologies compared to the EUV lithography system, such as photoresist and developer.

It is an objective to provide a mask in the lithography system without local high temperature issue compared to the EUV lithography system by keeping a grounded metallic mask at a pre-determined temperature. The local high temperature issue may incur pattern distortion in the exposure process.

It is an objective to provide a lithography system without stochastic issue existed in the EUV lithography system and simpler exposure process by using high resolution charged particle beam.

It is an objective to provide a mask with high reliability and life in the exposure process by non-contact to the photoresist layer, compared to conventional nano-imprint lithography (NIL).

It is an objective to provide an in-situ mask inspection system and method such that mask can be inspected within the present lithography system. Due to the ebeam system must be operated inside vacuum environment, the mask inside and outside the chamber of the lithography system should be experience with evacuation and venting. Too much possibility causing contamination during the mask transfer. The in-situ mask inspection system can further guarantee mask situation and health in the lithography apparatus, especially during the exposure procedures.

It is an objective to provide high throughput lithography system by using multiple electron beams on an array of metallic mask. The array of metallic mask can be assembled or manufactured directly.

In the present invention, a collimated charged particle beam is provided from a source and passes through a grounded metallic mask, such that the patterns on the metallic mask can be transferred to a photoresist layer. Charged particle beam has ultra-high resolution compared to the EUV lithography system.

In the present invention, a charged particle optical element, which is telecentric, is used to collimate the charged particle beam. The charged particle optical element may be a condenser lens or two condenser lenses.

In the present invention, the charged particle beam will have a relative large beam spot to illuminate the metallic mask, wherein the charged particle beam will be incident to the sample substantially vertically.

In the present invention, a booster is configured between the metallic mask and the charged particle optical element to accelerate the charged particle beam, such that Coulomb compel force can be mitigated.

In the present invention, the charged particle beam will be shaped to a linear beam in a first direction with the stage movable in a second direction perpendicular to the first direction.

In the present invention, the landing energy, beam current and spot size of the lithography system are adjustable.

In the present invention, the metallic mask has patterns identical to the patterns transferred to the photoresist layer and is adjacent to the photoresist layer without contact.

In the present invention, materials of the metallic mask may include Au, Ru, Rh, Pd, Os, Ir, or Pt, or alloy thereof.

In the present invention, the metallic mask is grounded and kept at a pre-determined temperature. If necessary, the metallic mask can be positive biased to a voltage to constitute an electrostatic lens with the sample.

In the present invention, the metallic mask can be coated with a file to enhance rigidity of the metallic mask.

In the present invention, the photoresist layer and developer can be conventional used in the EBDW.

In the present invention, maglev stage for mounting sample and maglev platform for mounting the metallic mask can be applied to enhance throughput.

Accordingly, the invention provides a lithography apparatus, which comprises a charged particle source for providing a charged particle beam, a charged particle optical element for collimating the charged particle beam onto a sample, and a grounded metallic mask between said charged particle source and the sample, wherein said metallic mask includes at least a pattern such that a portion of the charged particle beam is blocked by said metallic mask.

The lithography apparatus of the present invention may further include a maglev stage for mounting the sample and a maglev stage for mounting said grounded metallic mask.

In the present invention, the metallic mask may include gold.

In the present invention, the pattern of said metallic mask has an upper opening and a lower opening larger than the upper opening, and is coated with a film to enhance rigidity of the metallic mask.

In the present invention, the charged particle source provides electrons.

In the present invention, the charged particle optical element is telecentric.

The lithography apparatus of the present invention may further include a booster below the condenser lens for accelerating the charged particle beam.

In the present invention, the charged particle optical element includes an upper condenser lens and a lower condenser lens adjacent to the metallic mask.

In the present invention, the charged particle optical element includes a linear condenser lens to focus the charged particle beam in a first direction and collimate the charged particle beam in a second direction perpendicular to the first direction.

In the present invention, the linear condenser lens includes a Wien filter condenser lens.

In the present invention, the linear condenser lens includes a first Wien filter condenser lens and a second Wien filter condenser lens.

The present invention also provides a system for in-situ inspecting mask in the lithography apparatus, which comprises a transparent substrate for mounting the sample, a phosphor layer coated on said transparent substrate, a sensor array for receiving excited light from the phosphor layer, and an optical element for projecting said excited light to said sensor array.

The present invention further provides an electron beam lithography apparatus, which comprises an electron source providing an electron beam, a condenser lens for condensing the electron beam, a linear condensing lens below the condenser lens for linear collimating the electron beam along a first direction on a sample, a grounded metallic mask between said linear condensing lens and the sample, and a maglev stage for mounting the sample and moving in a second direction perpendicular to the first direction, wherein said metallic mask includes at least a pattern such that a portion of the electron beam is blocked by said metallic mask.

In the present invention, the linear condensing lens is telecentric along the first direction.

In the present invention, the linear condensing lens includes a Wien filter condenser lens.

In the present invention, the linear condensing lens includes a first Wien filter condenser lens and a second Wien filter condenser lens.

In the present invention, the metallic mask includes gold.

In the present invention, the pattern of the metallic mask has an upper opening and a lower opening larger than the upper opening, and is coated with a film to enhance rigidity of the metallic mask.

The present invention further provides an apparatus for assembling a plurality of clone masks into an array mask on a mesh for supporting the plurality of clone masks, which comprises an adjustable platform for temporally fasten one of the plurality of clone masks to fit one opening of the mesh, and a calibration and alignment tool for measuring the one of the plurality of clone masks such that said the adjustable platform moves the one of the plurality of clone masks to a pre-determined position.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

Further advantages of the present invention may become apparent to those skilled in the art with the benefit of the following detailed description of the preferred embodiments and upon reference to the accompanying drawings in which.

Figure 1A:
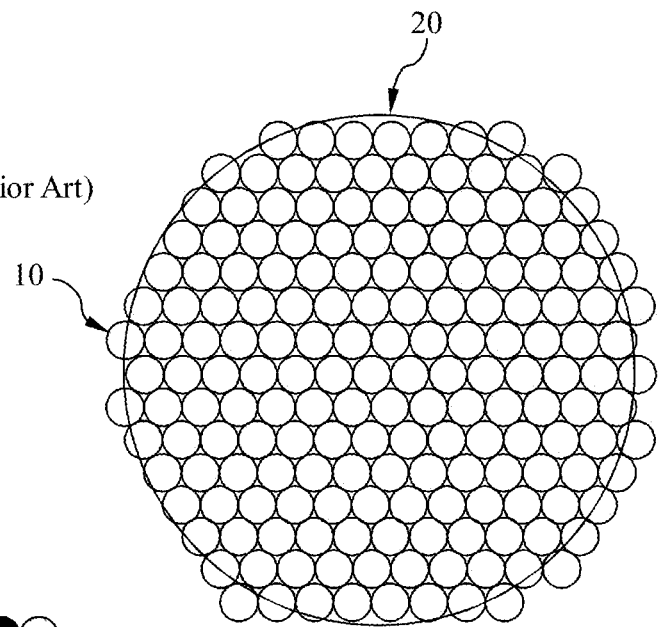
FIG. 1A is a schematic illustration of a circle pattern with diameter 13.5 nm to be formed on a photoresist layer in the lithography process.
Figure 1B:
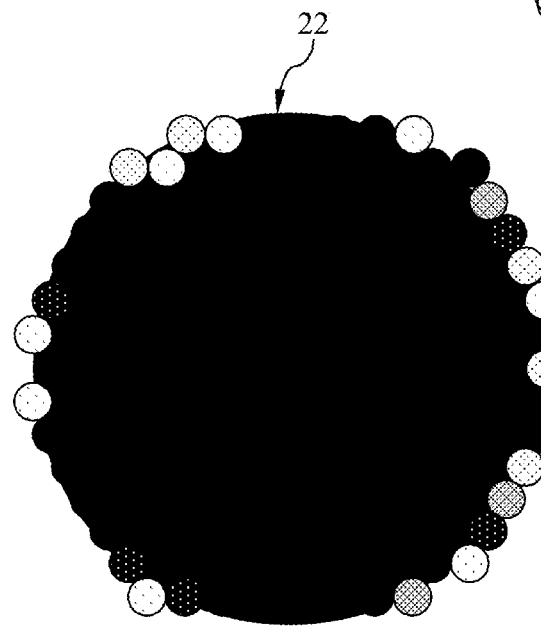
FIG. 1B is a simulated schematic illustration of a plurality of EUV photons impinged in the 13.5 nm circle pattern on the photoresist layer.
Figure 1C:
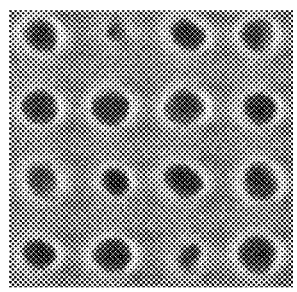
FIG. 1C is a photograph illustrating stochastic issue by using EUV lithography.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

As used herein, the term "wafer" generally refers to substrates formed of a semiconductor or non-semiconductor material. Examples of such a semiconductor or non-semiconductor material include, but are not limited to, monocrystalline silicon, silicon carbide, gallium arsenide, and indium phosphide. Such substrates may be commonly found and/or processed in semiconductor fabrication facilities.

One or more layers may be formed upon a wafer. Many different types of such layers are known in the art, and the term wafer as used herein is intended to encompass a wafer on which all types of such layers may be formed. One or more layers formed on a wafer may be patterned. For example, a wafer may include a plurality of dice, each having repeatable patterned features. Formation and processing of such layers of material may ultimately result in completed semiconductor devices. As such, a wafer may include a substrate on which not all layers of a complete semiconductor device have been formed or a substrate on which all layers of a complete semiconductor device have been formed.

The wafer may further include at least a portion of an integrated circuit (IC), a thin-film head die, a micro-electromechanical system (MEMS) device, flat panel displays, magnetic heads, magnetic and optical storage media, other components that may include photonics and optoelectronic devices such as lasers, waveguides and other passive components processed on wafers, print heads, and bio-chip devices processed on wafers.

The term, charged particle, is any particle positive or negative charged. The most used charged particle is negative charged particle which is electrons. However, other charged particles such as He nucleus, He, Li, Na, K, Cs, Al, Ga, In, Ag, Be, and Se ions, and Ag, Al, As, Au, B, Be, Bi, Ce, Co, Cr, Cs, Cu, Dy, Er, Ga, Ge, Hg, In, K, Li, Mg, Mn, Na, Nb, Nd, Ni, P, Pb, Pd, Pr, Pt, Rb, Sb, Si, Sm, Sn, U, Y, and Zn alloy ion sources, can be applied to the present invention.

The terms, charged particle optics, in the present invention relate to optics by using electrostatic lens or magnetic lens to shape charged particles. And the terms, electron optics, refer to charged particle optics when source of the charged particle is electron.

The terms, electrostatic lens, refers to shape, collimate, or focus charged particle beams by using electrostatic field. The generation of the electrostatic field is by using electric poles or electrodes. And the terms, magnetic lens, refers to shape, collimate or focus charged particle beams by using magnetic field. The generation of the magnetic field is by using high magnetic conductive materials wound by excitation coils.

The term, collimating, in the present invention refers to shape the charged particle beam incident to the mask and the photoresist layer vertically or substantially vertically.

The term, photoresist or resist, in the present invention will be dedicated to resist layers exposed and developed by charged particle instead of "photons". Suitable initiator and corresponding development will be selected for a specific charged particle source.

The term, mask or reticle, in the present invention refers to a template used in the lithography process, such that patterns on the mask or reticle can be transferred to a photoresist layer in the lithography process. The term mask always includes the patterns thereon identical to the pattern developed on the photoresist layer, while the term reticle always includes the patterns thereon quadruple or quintuple large than the patterns developed on the photoresist layer.

The term, grounded or grounding, in the present invention refers to charges on a material can be removed very fast by electrically connecting to a relative large capacitor, such as earth.

Turning now to the drawings, it is noted that the figures are not drawn to scale. In particular, the scale of some of the elements of the figures is greatly exaggerated to emphasize characteristics of the elements. It is also noted that the figures are not drawn to tie same scale. Elements shown in more than one figure that may be similarly configured have been indicated using the same reference numerals.

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not be used to limit the present invention to specific charged particles.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

Figure 2:
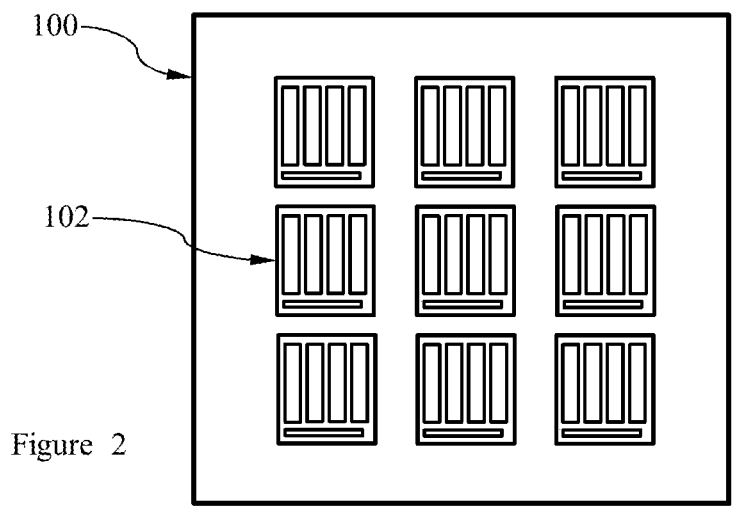
FIG. 2 is a schematic illustration of a reticle.

In the present invention, mask has 1:1 pattern identical to pattern on the wafer. Conventional reticle includes nine dice thereon with patterns. For DUV reticle, substrate is quartz with chromium patterns thereon, while for EUV reticle, substrate is quartz with reflective metal layers completely formed thereon, and DUV or EUV reticles are manufactured by using matured ebeam direct writer (EBDW). In the present invention, a master mask 100, as shown in FIG. 2, can be made by using conventional EBDW with several dice 102 thereon. Then, clone mask can be made by using NIL with the master mask. The clone mask is made of metal and patterns are through openings. Each clone mask has one die only. Detailed structure of the clone mask will be explained later.

Figure 3:
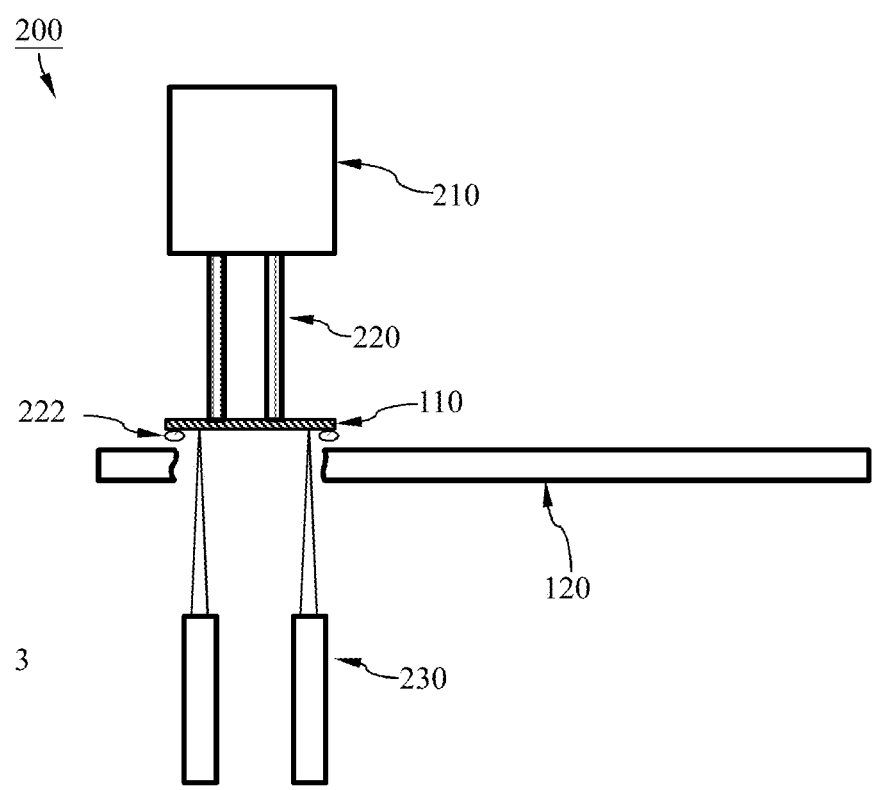
FIG. 3 is a schematic illustration of a system for assembling a plurality of clone masks in accordance with one embodiment of the present invention.
Figure 4A:
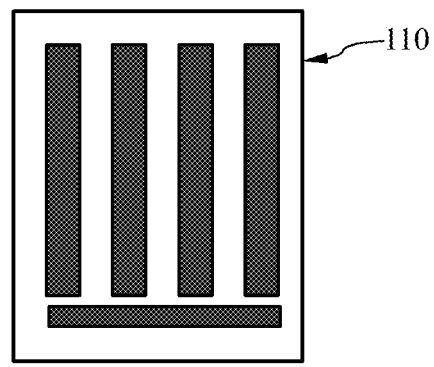
FIG. 4A is a schematic illustration of a clone mask with single die in accordance with one embodiment of the present invention.
Figure 4B:
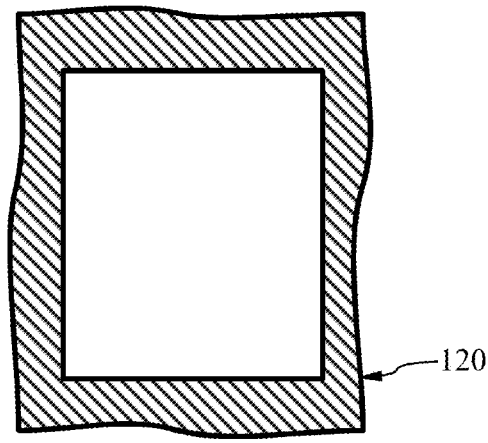
FIG. 4B is a schematic illustration of a mesh for supporting single clone mask in accordance with one embodiment of the present invention.
Figure 4C:
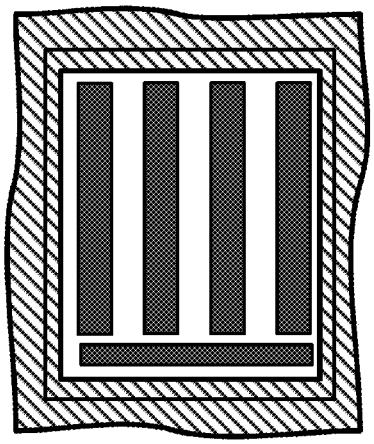
FIG. 4C is a schematic illustration of the clone mask allocated on the mesh in accordance with one embodiment of the present invention.

When several clone masks are made, they can be assembled together to enhance throughput. Please refer to FIG. 3, an alignment tool 200 is illustrated to assemble clone mask 110 to a mesh support 120. An adjustable platform 210 with vacuum chuck 220 to temporally fasten the clone mask 110 and a calibration/alignment tool 230 to measure positions of the clone mask 110. When the clone mask 110 fits the right position by the adjustable platform 210, glue 222 will fasten the clone mask 110 to the mesh support 120. FIG. 4A illustrates a clone mask 110 with patterns thereon and FIG. 4B illustrates a portion of mesh support 120 with an opening. FIG. 4C illustrates the clone mask 110 fits on the mesh support 120.

Figure 5A:
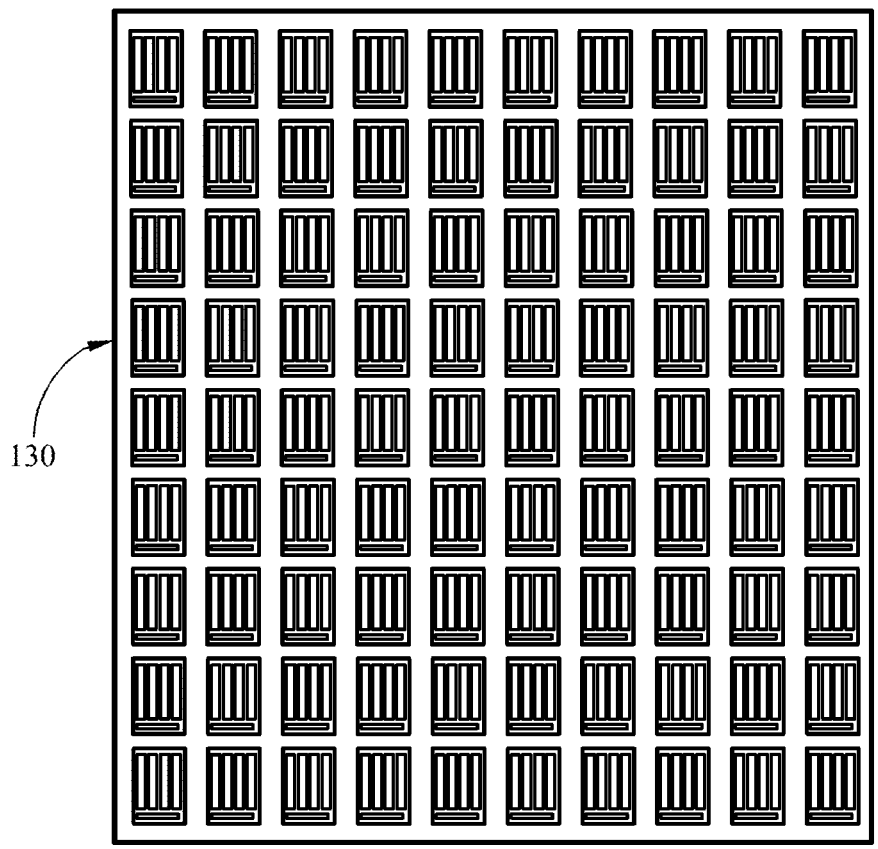
FIG. 5A is a schematic illustration of mask array assembled by a plurality of clone mask in accordance with one embodiment of the present invention.
Figure 5B:
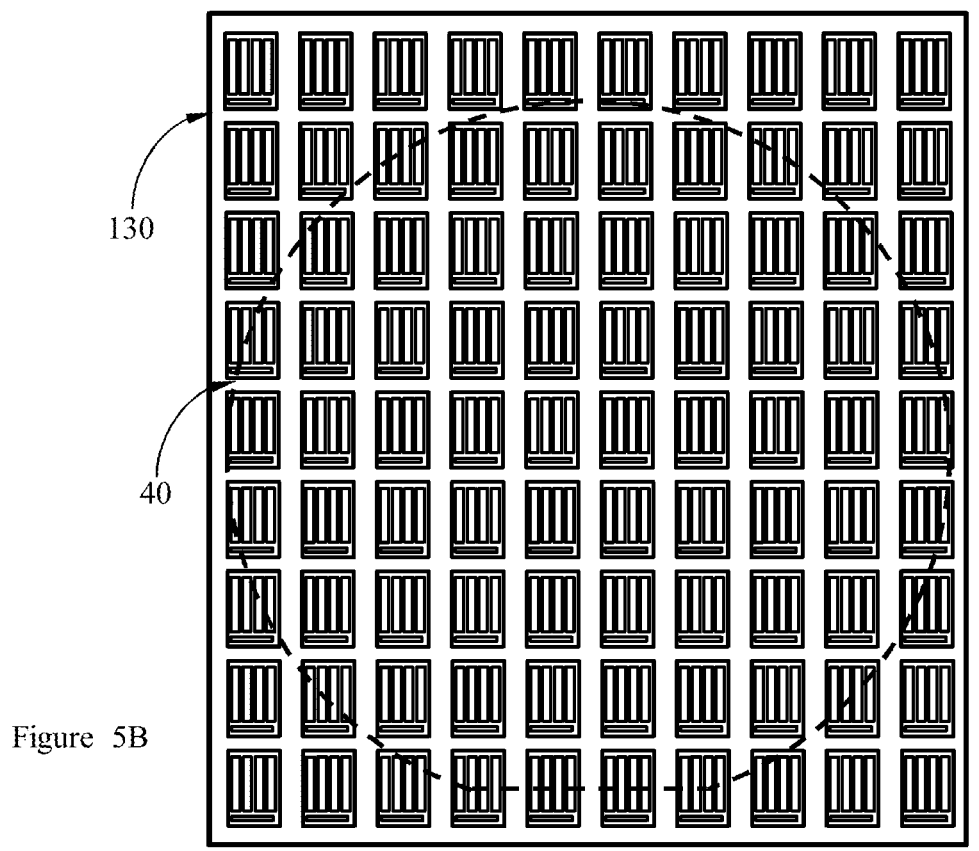
FIG. 5B is a schematic illustration of mask array fit with full wafer in accordance with one embodiment of the present invention.
Figure 5C:
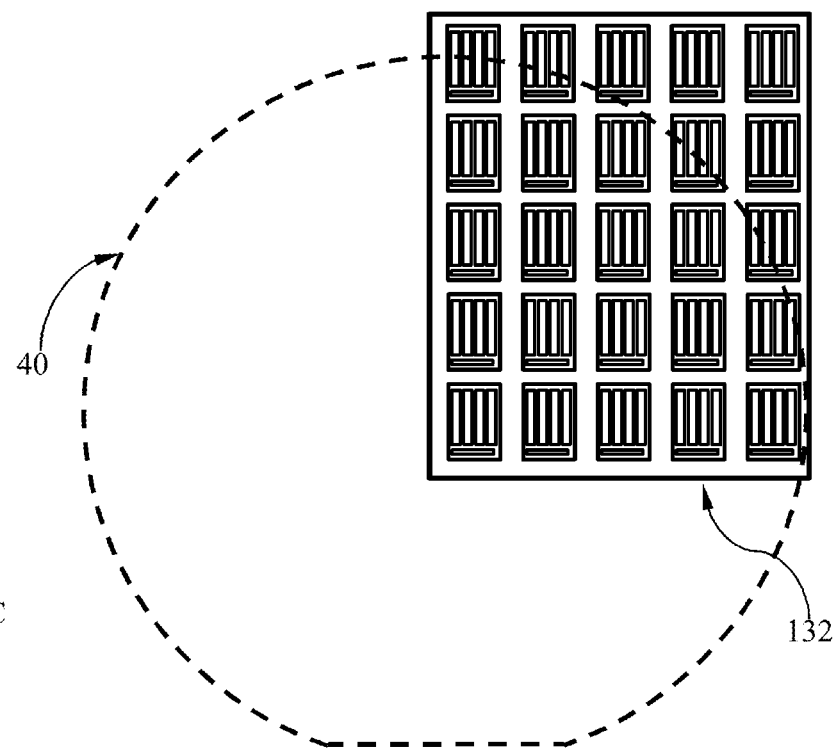
FIG. 5C is a schematic illustration of mask array fit a portion of a wafer in accordance with another embodiment of the present invention.

An array of clone mask 130 thus can be provided for the charged particle beam lithography to enhance throughput, as shown in FIG. 5A. In one embodiment, the mask array 130 can cover the area of a wafer 40, as shown in FIG. 5B. In this embodiment, in the later lithography process, after the array mask 130 is aligned to the wafer 40, there is no necessary to move the array mask 130 and can have the best throughput. However, to make such a large number of clone masks 110 will incur too heavy weight of the array mask 130. A compromise solution, as shown in FIG. 5C, is to have a small mask array 132 to cover a portion of a wafer 40.

Figure 6:
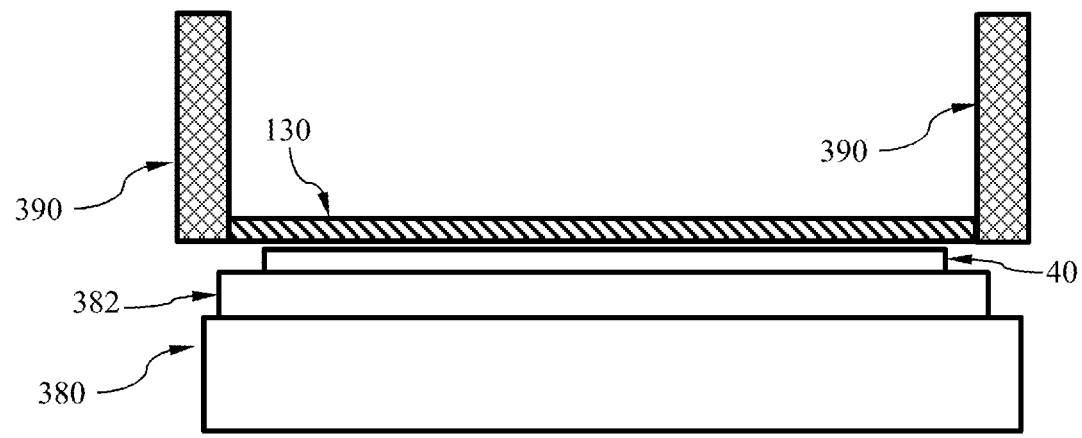
FIG. 6 shows mask array configured to the wafer in accordance with one embodiment of the present invention.

In the lithography process, the mask array 130 should be close to the photoresist layer on the wafer 40 enough but no contact to the photoresist layer, as shown in FIG. 6. A preferred distance between the mask array 130 and the wafer 40 could be ranged from 5 nm to 50 nm. If the distance is too close to the photoresist layer of the wafer, secondary electrons emanated from the photoresist layer may contaminate the mask array after the charged particle beam impinged to the photoresist layer. On the other hand, if the distance is too large, the pattern transferred from the mask array 130 to the photoresist layer may be distortion.

Please still refer to FIG. 6, the wafer 40 is supported by a z-stage 382 and an x-y stage 380, such that wafer 40 can be moved vertically and horizontally in the exposure process. The mask array 130 is mounted to an x-y platform 390 for alignment concern. If the mask array 130 can't cover the whole wafer 40, the x-y platform 390 has to move in the exposure process.

Figure 7:
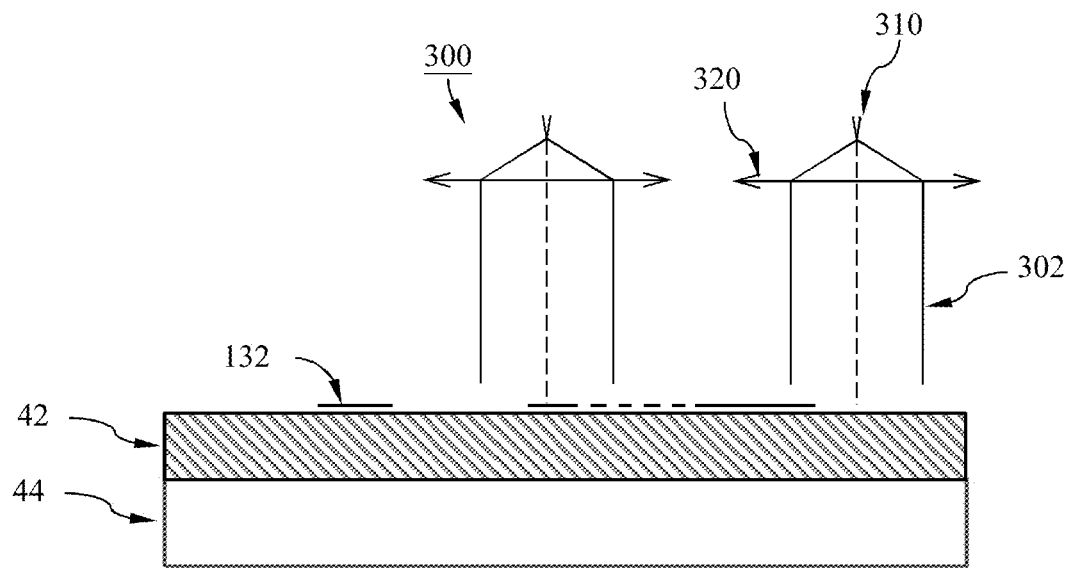
FIG. 7 is a schematic illustration of charged particle beams lithography in accordance with one embodiment of the present invention.

Please refer to FIG. 7, two charged particle beam systems 300, in one embodiment, are configured on the mask array 132 to expose the photoresist layer 42 on a substrate layer 44. Each charged particle beam system 300 includes a source 310 for providing a charged particle beam 302 and a charged particle optical element 320 for collimating the charged particle beam 302 to the mask array 132 and the photoresist layer 42. The charged particle beam system 300 in the present invention could be one, but the more charged particle beam systems 300, the more throughput will be gained. The charged particle beam 302 will have a relatively large beam spot instead of being focused. Thus, a portion of the charged particle beam 302 will be blocked by the mask array 132 such that patterns on the mask array 132 will be transferred to the photoresist layer 42 after the photoresist layer 42 is exposed to the charged particle beam 302 and developed.

In the following embodiments, electron beam will be used as the charged particle beam for conveniently. Thus, the photoresist layer 42 in the embodiments could be the same in the EBDW and the exposure parameters, such as landing energy and beam current, could be close to the art used in conventional EBDW. The developer could be used as the art of the EBDW again without further research and develop.

Figure 8A:
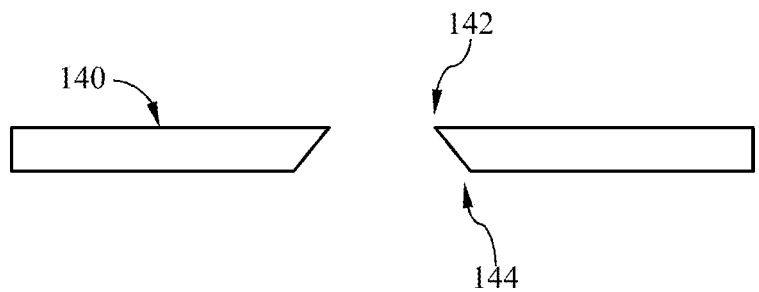
FIG. 8A is a schematic illustration of a metal mask with an opening pattern in accordance with one embodiment of the present invention.
Figure 8B:
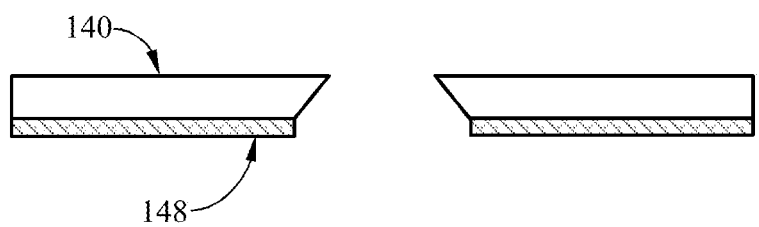
FIG. 8B is a schematic illustration of a metal mask with high rigidity coating in accordance with another embodiment of the present invention.

Please refer to FIG. 8A, detail structure of a clone mask 110 is disclosed in which the clone mask has a metal substrate 140. The metal substrate 140 has a pattern which is a through hole. The electron beam will be incident from upside down through the pattern hole. The through hole has an upper opening 142 and a lower opening 144 which large than the upper opening 142. Materials of the metal substrate 140 may include Au, Ru, Rh, Pd, Os, Ir, or Pt, or alloy thereof. The metal substrate 140 must be grounded in the exposure process to fast absorb the electron beam and reduce the secondary electrons emanated from the metal substrate 140 per se. The metal substrate 140 may be positively biased to cooperate with the electron optical element in the ebeam system 300. Further, the metal substrate 140 should be kept constant temperature in the exposure process to avoid the pattern distortion. In order to enhance the rigidity of the metal mask 140, a film 148 can be coated on the back side of the metal mask 140, as shown in FIG. 8B. The film 148 could be diamond-like film or some other material to increase rigidity of the metal mask 140.

Figure 9A:
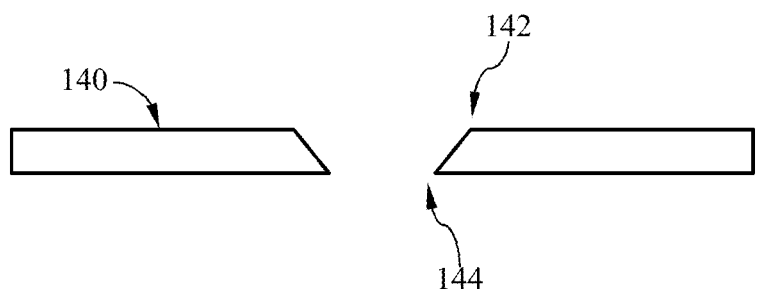
FIG. 9A is a schematic illustration of a metal mask with an opening pattern in accordance with another embodiment of the present invention.
Figure 9B:
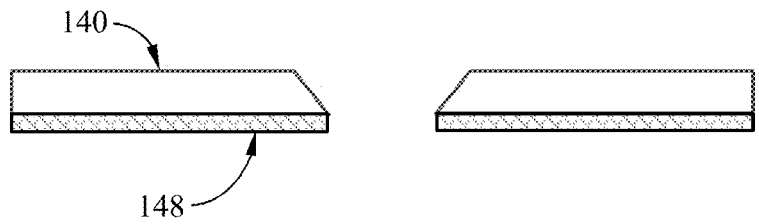
FIG. 9B is a schematic illustration of a metal mask with high rigidity in accordance with another embodiment of the present invention.

Please refer to FIG. 9A and FIG. 9B, another design of the metal mask 140 is disclosed, in which the upper opening 142 of the through hole is smaller than the lower opening 144.

Figure 10A:
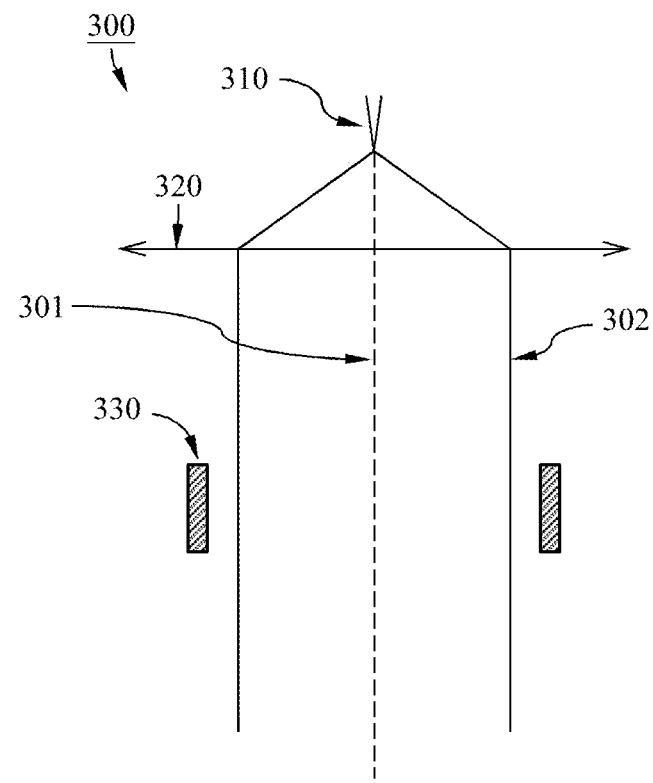
FIG. 10A is a schematic illustration of an ebeam lithography system in accordance with one embodiment of the present invention.

Detailed structure of the ebeam system 300 can be referred to FIG. 10A. An electron source 310 provides an electron beam 302 with an optical axis 301. The electron beam 302 is collimated by an electron optical element 320 such that the electron beam can pass the metal mask 140 and reach the photoresist layer 42 substantially vertically. The electron optical element 320 in the present invention may be a telecentric lens or a condenser lens, and can be magnetic lens or electrostatic lens. A blanker 330 is provided if the electron beam 302 is not necessary.

Figure 10B:
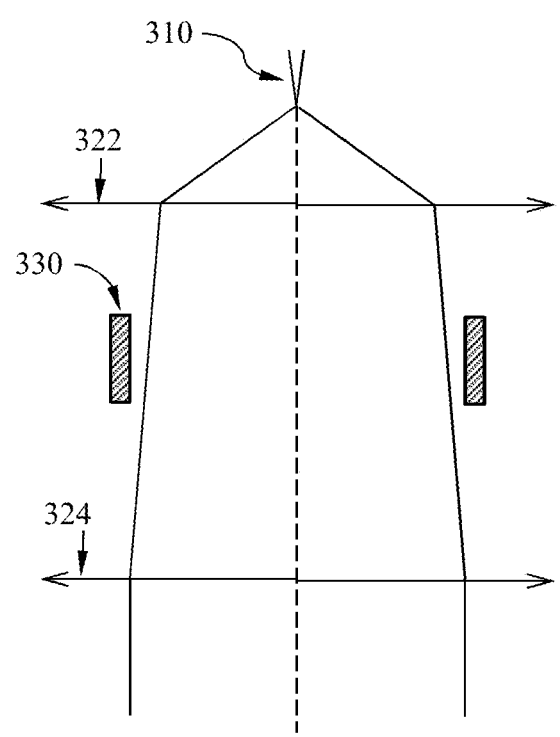
FIG. 10B is a schematic illustration of an ebeam lithography system in accordance with another embodiment of the present invention.

In this invention, in order to increase throughput, the more beam current would be preferred. However, the more beam current, the larger Coulomb compulsive force will be, and the electron beam could not be collimated well. The cross-sectional area of the electron beam thus will increase gradually, and each electron can't pass through the metal mask 140 vertically. Therefore, one condenser lens may not sufficient to collimate the electron ebeam 302 substantially vertically to the metal mask 140. Thus a first condenser lens 322 and a second condenser lens 324 are cooperated with each other to make sure the electron beam 302 could be collimated vertically, as shown in FIG. 10B. The second condenser lens 324 should be close to the metal mask 140 such that electron beam 302 is condensed by the second condenser lens 324 will pass the metal mask 140 vertically.

Figure 10C:
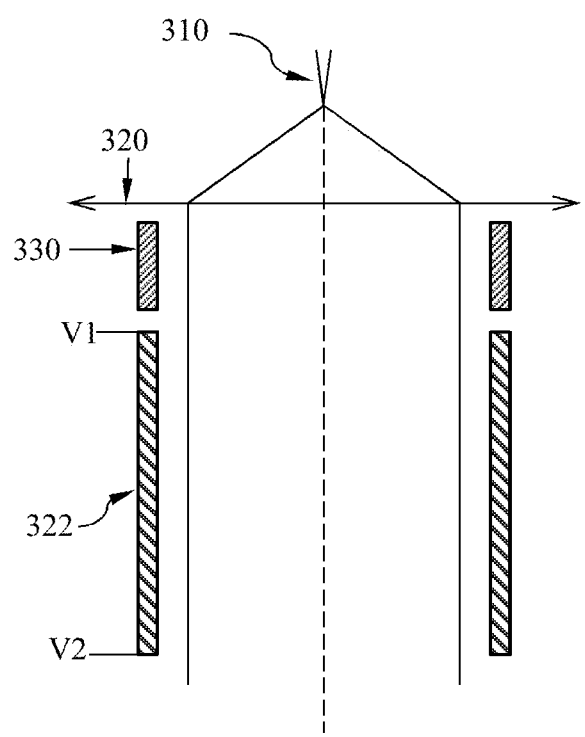
FIG. 10C is a schematic illustration of an ebeam lithography system in accordance with another embodiment of the present invention.

Another method to mitigate the Coulomb compulsive force can be referred to FIG. 10C. A booster 322, below the blanker 330, accelerates the electron beam with a first voltage V1 and a second voltage V2 applied to the two ends of the booster 332. The booster 322 will accelerate the electron beam 302 to reach the metal mask 140 as soon as possible such that beam spot expansion could be mitigated.

Figure 11A:
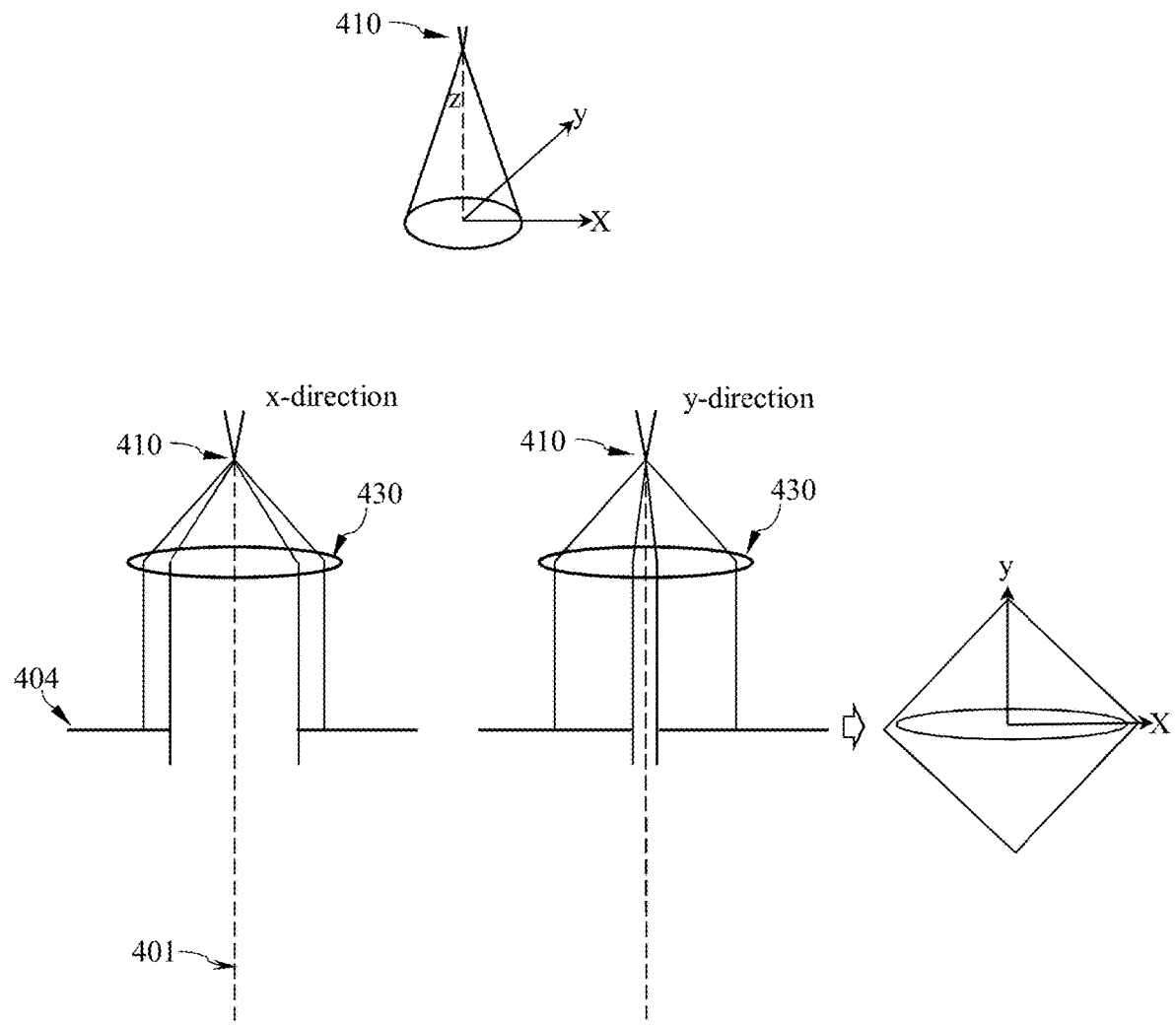
FIG. 11A is a schematic illustration of an ebeam lithography system with linear illumination in accordance with one embodiment of the present invention.

The above described ebeam system 300 will generate a circular beam spot or Gaussain distribution. However, if a linear beam could be generated, the ebeam could scan the metal mask 140 more efficiently without considering beam current to the photoresist layer, when the circular ebeam spot is used to scan across the metal mask. Please refer to FIG. 11A, the electron source 410 still provide an electron beam with an optical axis 401. Coordinate of the ebeam system can be referred to the upper drawing of the FIG. 11A, in which the optical axis is z axis while x-y plane is perpendicular to the z axis. In the x-direction, the linear condenser lens 430 will not condense the ebeam, while in the y-direction, the ebeam will be condensed by the linear condenser lens 430. In the aperture plane 404, cross sectional shape of the ebeam will be linear along the x-direction.

Figure 11B:
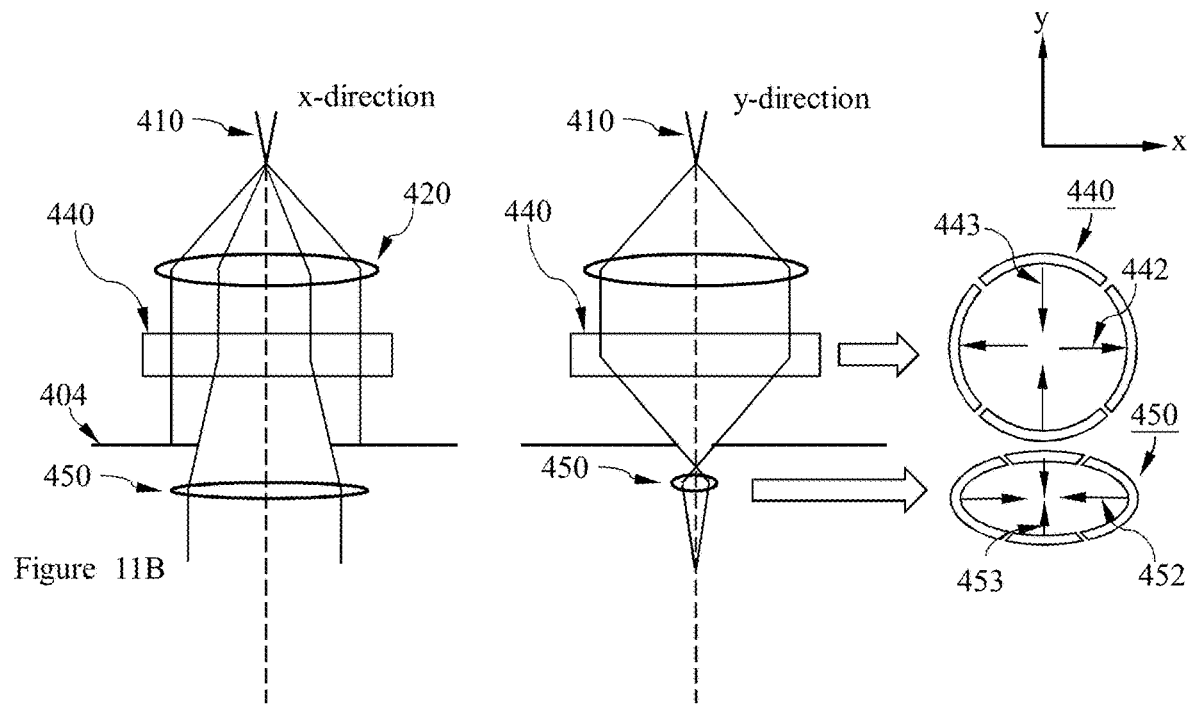
FIG. 11B is a schematic illustration of an ebeam lithography system with linear illumination in accordance with another embodiment of the present invention.

One embodiment to illustrate a detailed electron optics of the linear condenser lens can be referred to FIG. 11B. The electron source 410 provides an electron beam with circular spot and then condensed by a conventional condenser lens 420 in both x and y directions. Then, a four-pole electrostatic lens 440 will provide electric forces 442 opposite from the optical axis along the x-direction and thus the electron beam in x-direction will expand. The electron beam in the x-direction will be trimmed by the aperture plane 404 and later converged by an elliptical four-pole electrostatic lens 450. The elliptical four-pole electrostatic lens 450 will provide electric forces 452 to the optical axis along the x-direction such that the electron beam will be converged and collimated.

On the other hand, the electron beam in the y-direction will be converged by the four-pole electrostatic lens 440 due to the four-pole lens 440 will provide electric forces 443 to the optical axis along the y-direction and there will be an cross-over below the aperture plane 404. Then, the electron beam will be focused by the elliptical four-pole electrostatic lens 450, due to the elliptical four-pole electrostatic lens 450 will provide electric forces 453 to the optical axis along the y-direction, such that the electron beam in the y-direction can be focused. Thus, a liner electron beam along the x-direction is provided. For this kind of electron beam, the stage of the lithography system can be moved on the y-direction.

Figure 11C:
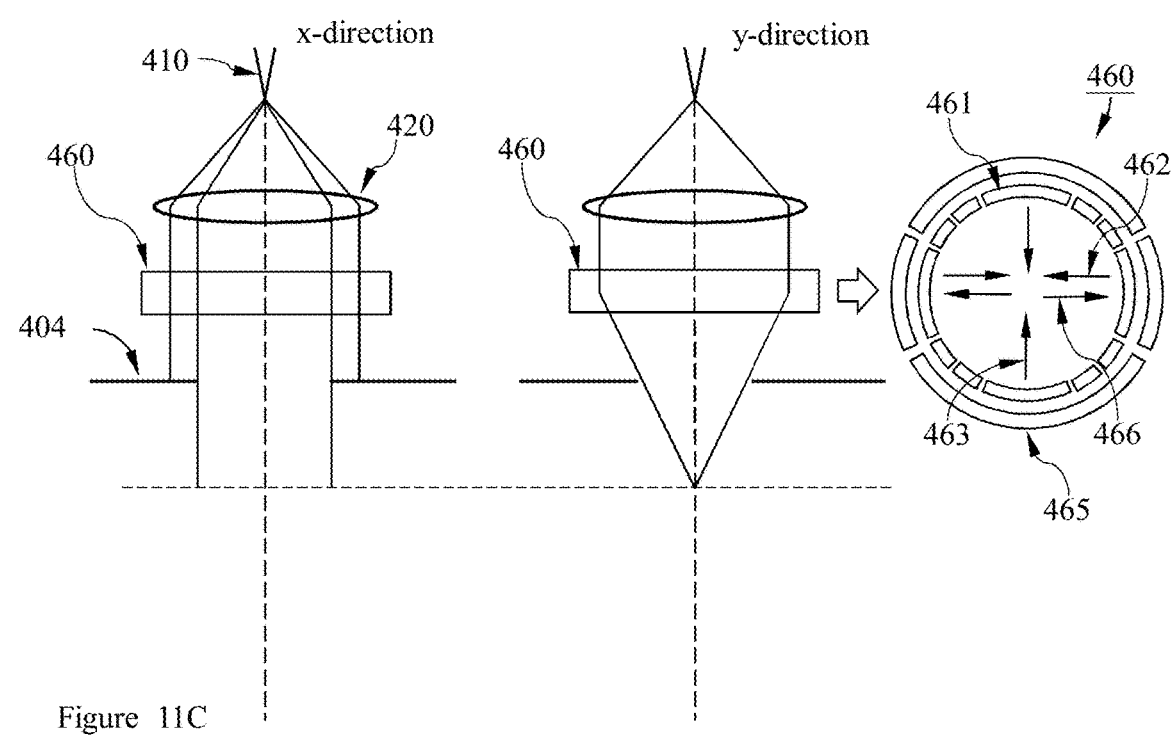
FIG. 11C is a schematic illustration of an ebeam lithography system with linear illumination in accordance with another embodiment of the present invention.

One embodiment to illustrate a detailed electron optics of the linear condenser lens can be referred to FIG. 11C. The electron source 410 provides an electron beam and then condensed by a conventional condenser lens 420 in both x-y directions. Then, a Wien filter lens 460 is provided as a linear condenser lens along the x-direction. The Wien filter lens 460 has the same electrostatic and magnetic poles but different electric field to the conventional Wein filter. The Wien filter lens 460 in the present invention includes electric lens 461 configured by 12 electric poles, and magnetic lens configured by four-pole magnetic pole 465. The electric lens will provide electric forces 462 to the optical axis along the x-direction and electric forces 463 to the optical axis along the y-direction. Thus, convergent forces to the electron beam in both x-y directions are provided. For the magnetic lens, a magnetic field is provided that magnetic forces 466 opposite to the optical axis along the y-direction are provided to exactly cancel the electric forces 462. Thus, the electron beam will not be condensed in the x-direction. An aperture plane 404 is also provided to trim the electron beam in the x-direction.

Figure 11D:
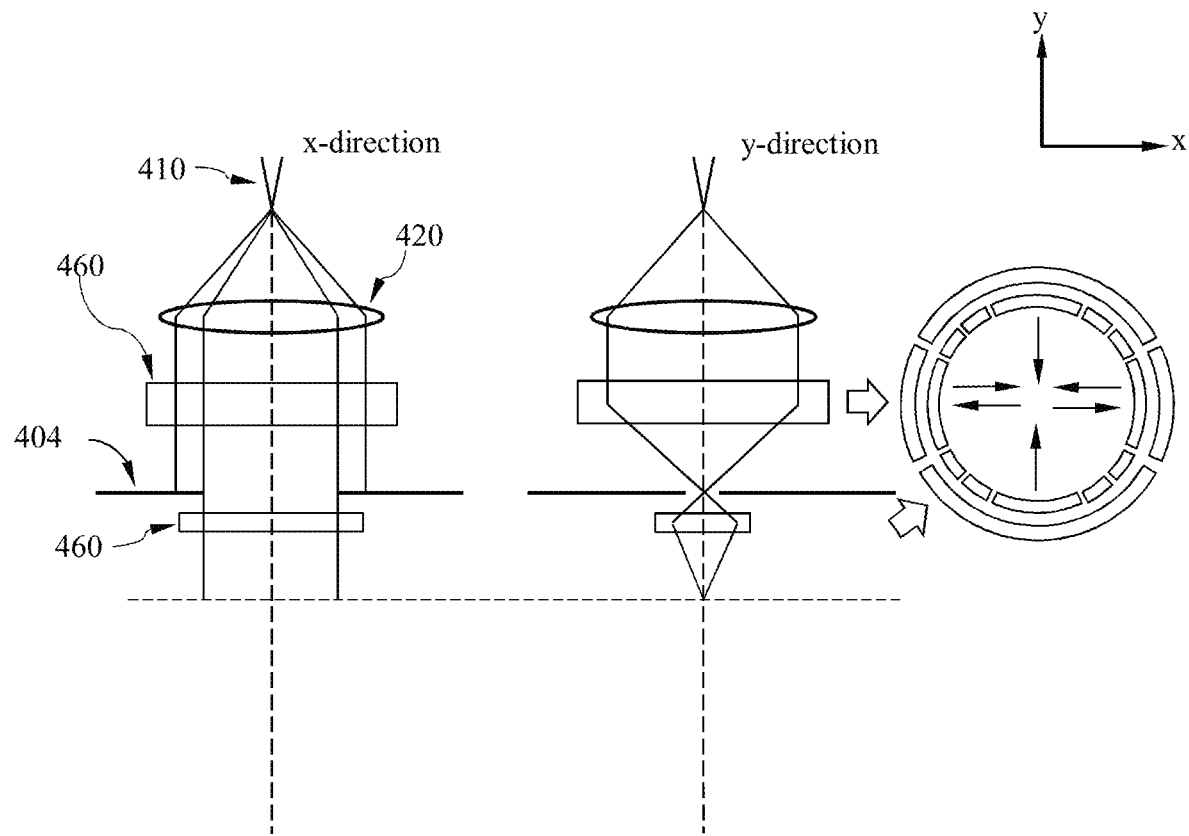
FIG. 11D is a schematic illustration of an ebeam lithography system with linear illumination in accordance with another embodiment of the present invention.
Figure 11E:
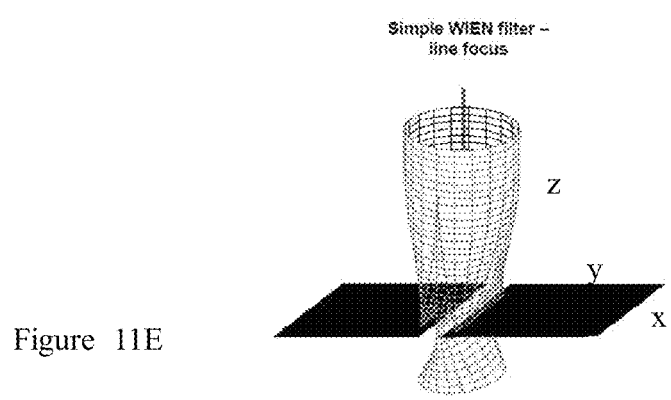
FIG. 11E is a simulation illustration of an electron beam focused by linear electron optical lens in accordance with FIGS. 11A to 11B.

Another embodiment to illustrate a detailed electron optics of the linear condenser lens can be referred to FIG. 11D. A second Wien filter lens 460 is provided below the aperture plane 404 such that the electron beam can be focused in the y-direction. FIG. 11E illustrates a simulation results of the Wien filter lens 460 in the above embodiments to linear condense a circular electron beam spot into a linear electron beam.

Figure 12A:
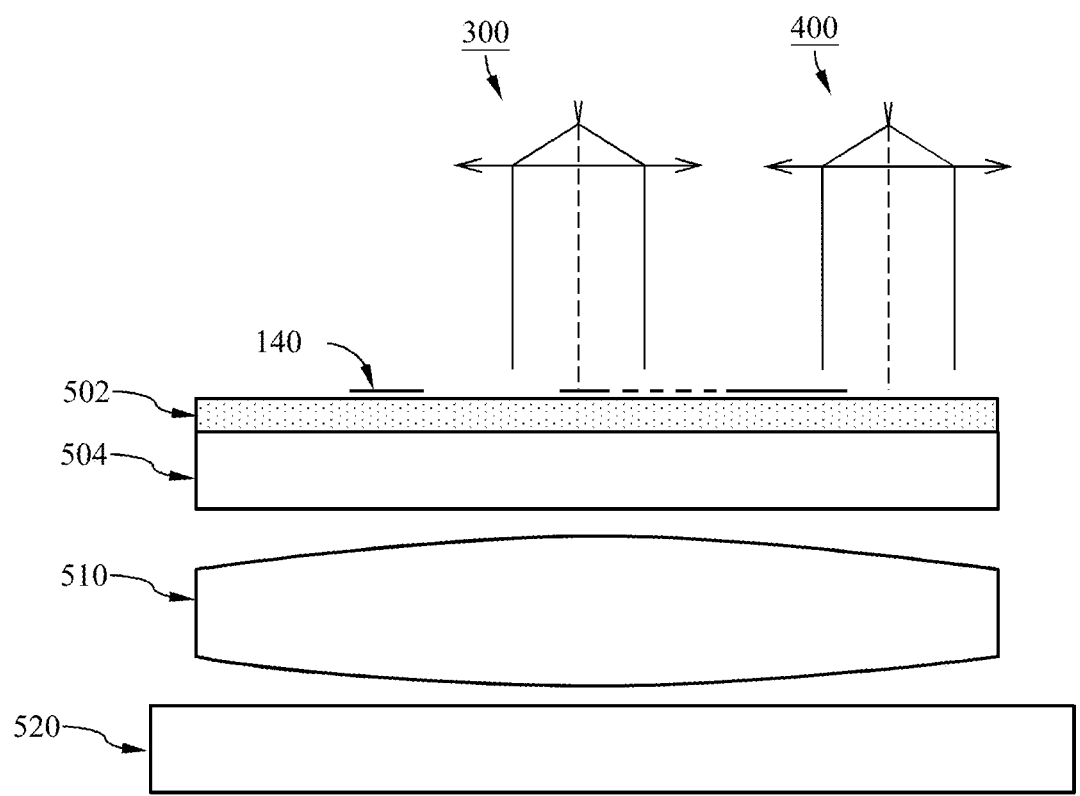
FIG. 12A is a schematic illustration of in-situ mask inspection in accordance with one embodiment of the present invention.

The present invention also provides a system to in-situ inspect the mask. Please refer to FIG. 12A, the ebeam systems 300 and/or 400 are provided to illuminate the mask 140, wherein the ebeam system 300 may include the circular electron beam spot while the ebeam system 400 includes a linear electron beam. A transparent substrate 504 with a phosphor layer 502 coated thereon such that the phosphor will be excited by the electron beam from the ebeam systems 300 and/or 400. The transparent substrate 504 should be glass or preferred quartz. One optical lens 510 below the transparent substrate 504 to magnify light of the excited phosphor and a CCD/CMOS sensor array 520 below the optical lens 510 to receive the light excited from the phosphor layer 502. Resolution of the CCD/CMOS sensor array 52 should at least have micrometer-scaled resolution and the optical lens 510 should have the magnification close to ×1,000. If there is a particle to block pattern on the mask 140, there will be some region dark corresponding to the image from the CCD/CMOS sensor array 520.

Figure 12B:
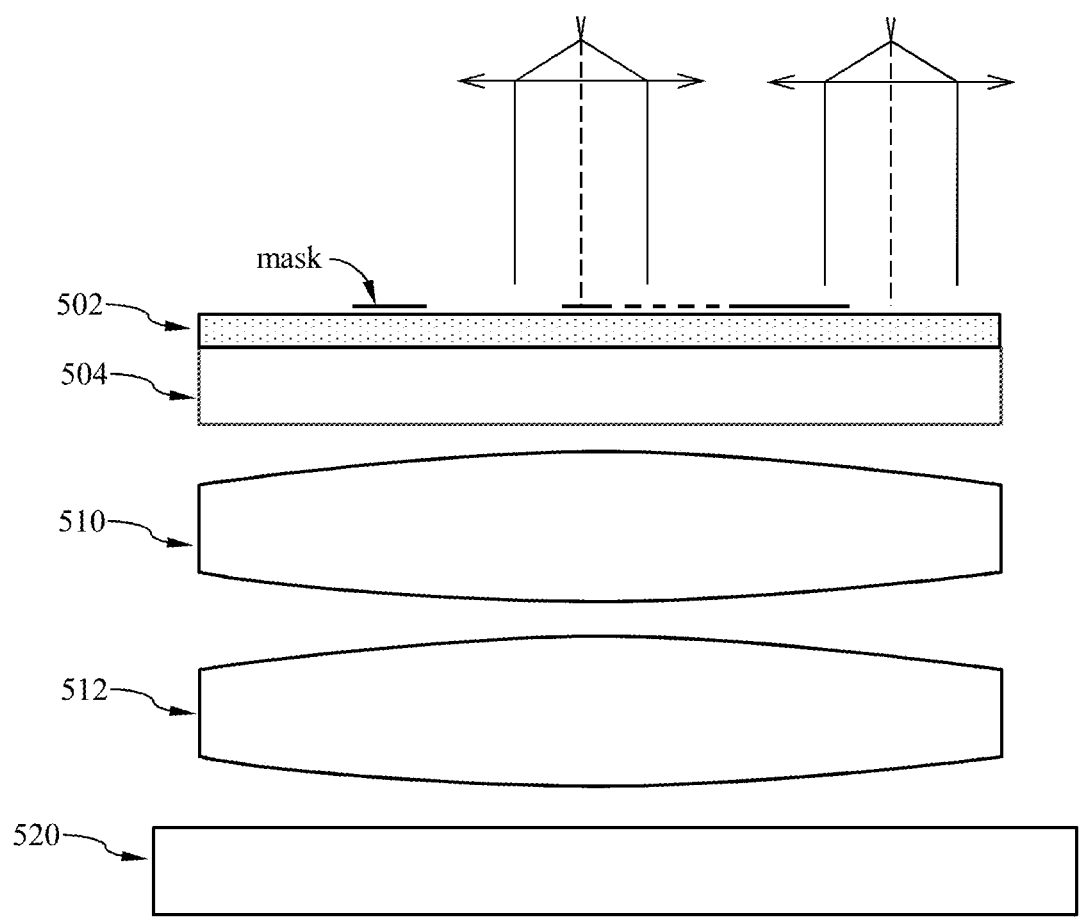
FIG. 12B is a schematic illustration of in-situ mask inspection in accordance with another embodiment of the present invention.
Figure 12C:
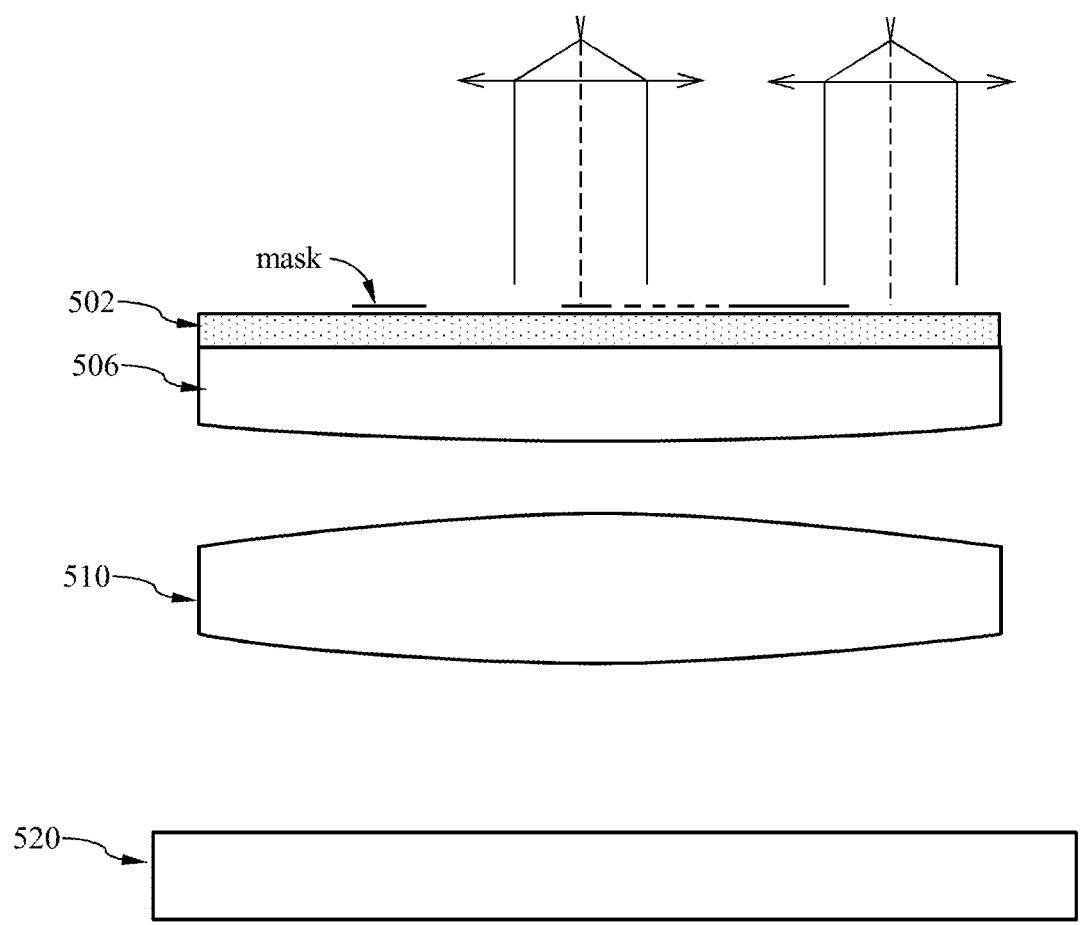
FIG. 12C is a schematic illustration of in-situ mask inspection in accordance with another embodiment of the present invention.

Another embodiment of in-situ mask inspection system can be referred to FIG. 12B, wherein a second optical lens 512 is provided such that both the optical lenses 510 and 520 can project the light excited from phosphor layer 502 to the CCD/CMOS sensor array 520. The second optical lens 512 can be designed to the transparent substrate 504. Please refer to FIG. 12C, the bottom of the transparent substrate 506 can be design as an optical lens such that light excited from the phosphor layer 502 can be projected to the CCD/CMOS sensor array 520 with the optical lens 510 only.

Figure 13:
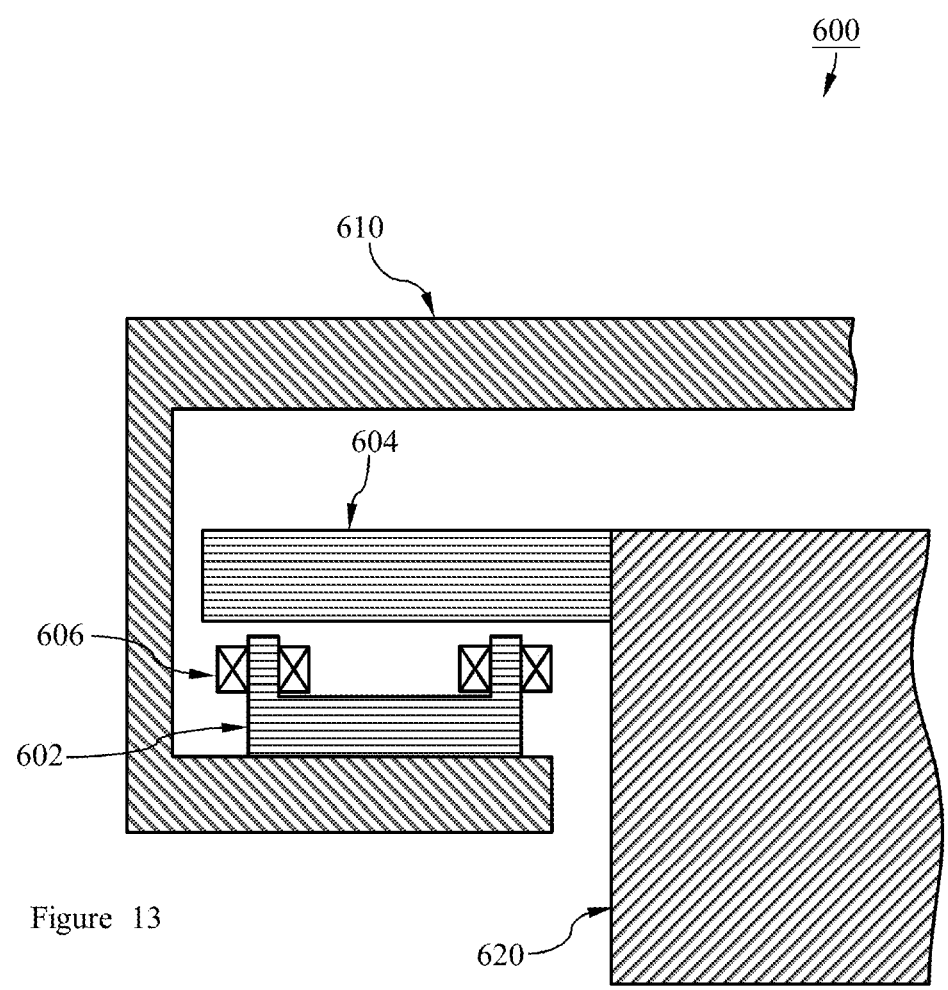
FIG. 13 is a cross-sectional schematic illustration of a slide rail of a maglev stage in accordance with one embodiment of the present invention.

In the present invention, in order to promote throughput, it would be preferred to use maglev stage or maglev platform in the lithography system. For conventional linear motor, the slide rail is contact type with lubricating oil. For the ebeam system, the operation environment is under vacuum and this kind of the conventional linear motor has limitation in the stage movement. A cross-sectional view of a slide rail of the maglev stage can be referred to FIG. 13, wherein a maglev stage 600 is provided. A high magnetic conductive yoke 602 is fastened to a movable plate 610 while a high magnetic conductive plate 604 is fastened to a static plate 620. An excitation coil 606 rounds the high magnetic conductive yoke 602. When electric current flows through the excitation coil 606, a magnetic force generated from the yoke 602 will repel the high magnetic conductive plate 604 and thus lift the movable plate 610 slightly. Thus there is no contact between the movable plate 610 to the static plate 620. The current through the excitation coil 606 can be controlled the height of the movable plate 610 and thus there is no necessary to configure another z-stage. Magnetic fields generated by the excitation coils 606 can be designed to be mostly inside the high magnetic conductive plate 604 and high magnetic conductive yoke 602 such that magnetic leakage is smaller than the earth's magnetic field. Therefore, the magnetic leakage generated from the maglev stage will not affect the electron beam in the ebeam system. The maglev stage 600 can be applied to mount wafer or metal mask in the present invention.

The present invention thus includes advantages over the prior lithography systems. First, resolution of the charged particle, such as electron beam, can be reached to 1.5 nm and can be higher if higher landing energy is provided. Other charged particles, due to large mass compared to the electrons, will have much higher resolution compared to electrons. However, for 1.5 nm resolutions in the lithography, it is enough to meet the requirement of the semiconductor manufacture, because there will be only four silicon atoms less than 5 nm and quantum effect may be included.

With this kind of high resolution, there is no OPC issue in the conventional DUV lithography system incurred from the interference of the DUV light. The pattern on the metallic mask is thus identical to the pattern on the photoresist layer; that's the original design pattern layout.

By using a metallic mask, the present invention can provide a high throughput compared to the conventional EBDW. Although the throughput of DUV lithography system is high to process about 250 wafers in one hour, however, multiple patterning are required to limit the complete patterning process. On the other hand, the present invention will provide only one-time patterning procedure, and the whole patterning procedure should be competitive to the conventional DUV lithography system.

The technologies used in the present invention, such as photoresist layer and developer, are matured and commercial available compared to the conventional EUV lithography system. Chemically amplified resist (CAR) issue in the EUV lithography will not happened to the present invention.

The metallic mask used in the present invention will be grounded and kept at a pre-determined temperature, so there is no local high temperature issue compared to the EUV lithography system, which may incur pattern distortion in the exposure process.

In the present invention, there is no stochastic issue of the EUV lithography system due to enough high resolution of the charged particle. The exposure process in the lithography system is also simpler.

The mask will by more reliability and has higher life due to no contact to the photoresist layer, compared to the conventional NIL.

The present invention can also inspect the metallic mask in-situ; that means the mask can be inspected in the present lithography apparatus. For the EUV lithography system, there is no commercial available tool to inspect the EUV mask. The NIL mask is now inspected by using SEM. The lithography system according to the present invention must be operated in the vacuum environment, and the mask should be transferred in and out of the vacuum environment if there is a dedicate mask inspection tool. The possibility of incurring particles to the mask transfer would be an issue. Thus, an in-situ mask inspection system and method would guarantee mask situation and health in the lithography system.

In order to increase throughput, the present invention also provides lithography system including multiple electron beams on an array of metallic mask. The array of metallic mask can be assembled by a plurality of clone mask.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A lithography apparatus for lithographying a photoresist layer on a substrate, comprising:
    a charged particle source for providing a charged particle beam;
    a charged particle optical element for collimating the charged particle beam into a collimated unfocused charged particle beam, wherein said collimated unfocused charged particle beam is to applied onto said photoresist layer on said substrate;
    a grounded metallic mask positioned above said photoresist layer on the substrate without contacting said photoresist layer; and
    a first stage for mounting the grounded metallic mask, wherein said first stage and said second stage move along a first direction, such that the unfocused charged particle beam scans on the sample;
    wherein said metallic mask includes at least a pattern for blocking a portion of said collimated unfocused charged particle beam before said collimated charged particle beam arrived at said photoresist layer on said substrate; and
    wherein the sample is mounted on a transparent substrate for mounting the sample, the transparent substrate is coated with a phosphor layer, a sensor array is provided for receiving excited light from the phosphor layer, and an optical element is provided for projecting said excited light to said sensor array.

2. The lithography apparatus according to claim 1, wherein said first stage is a first maglev stage and said second stage is a second maglev stage.

3. The lithography apparatus according to claim 2, wherein the metallic mask includes gold.

4. The lithography apparatus according to claim 3, wherein the pattern of said metallic mask has an upper opening and a lower opening larger than the upper opening, and is coated with a film to enhance rigidity of the metallic mask.

5. The lithography apparatus according to claim 4, wherein said charged particle source provides electrons.

6. The lithography apparatus according to claim 5, wherein the charged particle optical element is telecentric.

7. The lithography apparatus according to claim 6, further comprising a booster below a condenser lens.

8. The lithography apparatus according to claim 5, wherein the charged particle optical element includes an upper condenser lens and a lower condenser lens adjacent to the metallic mask.

9. A lithography apparatus for lithographying a photoresist layer on a substrate, comprising:
    a charged particle source for providing a charged particle beam;
    a charged particle optical element for collimating the charged particle beam into a collimated charged particle beam, wherein said collimated charged particle beam is to applied onto said photoresist layer on said substrate, wherein the charged particle optical element includes a linear condenser lens to focus the charged particle beam in a first direction and collimate the charged particle beam in a second direction perpendicular to the first direction; and
    a grounded metallic mask positioned above said photoresist layer on the substrate without contacting said photoresist layer;
    wherein said metallic mask includes at least a pattern for blocking a portion of said collimated charged particle beam before said collimated charged particle beam arrived at said photoresist layer on said substrate.

10. The lithography apparatus according to claim 9, wherein the linear condenser lens includes a Wien filter condenser lens.

11. The lithography apparatus according to claim 9, wherein the linear condenser lens includes a first Wien filter condenser lens and a second Wien filter condenser lens.

12. A system for in-situ inspecting the mask in the lithography apparatus according to claim 4-9, comprising:
    a transparent substrate for mounting the sample;
    a phosphor layer coated on said transparent substrate;
    a sensor array for receiving excited light from the phosphor layer; and
    an optical element for projecting said excited light to said sensor array.

13. An electron beam lithography apparatus, comprising:
    an electron source providing an electron beam;

a condenser lens for condensing the electron beam;

a linear condensing lens, below said condenser lens, for focusing the electron beam in a first direction and collimating the electron beam in a second direction orthogonal to the first direction, wherein the first direction and the second direction are linear collimating the electron beam along a first direction parallel to a sample;

a grounded metallic mask between said linear condensing lens and the sample, close to a photoresist layer on the sample without contacting the photoresist layer, wherein said metallic mask includes at least a pattern such that a portion of the electron beam is blocked by said metallic mask; and a maglev stage for mounting the sample and moving in a second direction perpendicular to the first direction.

14. The electron beam lithography apparatus according to claim 13, wherein said linear condensing lens is telecentric along the first direction.

15. The electron beam lithography apparatus according to claim 14, wherein said linear condensing lens includes a Wien filter condenser lens.

16. The electron beam lithography apparatus according to claim 14, wherein said linear condensing lens includes a first Wien filter condenser lens and a second Wien filter condenser lens.

17. The electron beam lithography apparatus according to claim 13, wherein the metallic mask includes gold.

18. The electron beam lithography apparatus according to claim 17, wherein the pattern of said metallic mask has an upper opening and a lower opening larger than the upper opening, and is coated with a film to enhance rigidity of the metallic mask.

* * * * *